(12) United States Patent
Testoni

(10) Patent No.: US 6,753,525 B1
(45) Date of Patent: Jun. 22, 2004

(54) MATERIALS ANALYSIS USING BACKSCATTER ELECTRON EMISSIONS

(75) Inventor: Anne L. Testoni, Bolton, MA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 0 days.

(21) Appl. No.: 10/335,274

(22) Filed: Dec. 31, 2002

Related U.S. Application Data

(60) Provisional application No. 60/427,905, filed on Nov. 19, 2002.

(51) Int. Cl.[7] ............................................... H01J 37/30
(52) U.S. Cl. ................................................... 250/310
(58) Field of Search .......................................... 250/310

(56) References Cited

U.S. PATENT DOCUMENTS

| | | | |
|---|---|---|---|
| 4,047,029 A | | 9/1977 | Allport |
| 4,559,450 A | * | 12/1985 | Robinson et al. ........... 250/310 |
| 6,452,176 B1 | * | 9/2002 | Davis ......................... 250/310 |

* cited by examiner

*Primary Examiner*—John H. Lee
*Assistant Examiner*—Phillip A. Johnston
(74) *Attorney, Agent, or Firm*—Beyer Weaver & Thomas, LLP

(57) ABSTRACT

Techniques for determining the composition of a specimen under inspection by measuring backscatter electron emissions and then estimating the atomic number of the specimen are described. Typically, this technique is useful for inspecting features, such as defects, upon very small specimens such as semiconductor wafers. Charged particle beams are typically required to cause backscatter electrons to emanate from a specimen. One embodiment of the present invention involves measuring the backscatter electron count or current of a reference sample for which the atomic number is known. Another embodiment involves the use of an atomic number lookup table that is organized by feature size parameters and normalized backscatter electron counts or currents.

10 Claims, 5 Drawing Sheets

|  | 502 | 504 | 506 | 508 |
|---|---|---|---|---|
|  | Size (um) | Atomic # A | Atomic # B | Atomic # C |
|  | 0.01 | 0.01 | 0.07 | 0.01 |
|  | 0.02 | 0.02 | 0.08 | 0.02 |
|  | 0.03 | 0.03 | 0.09 | 0.03 |
|  | 0.04 | 0.04 | 0.10 | 0.04 |
|  | 0.05 | 0.05 | 0.11 | 0.05 |
|  | 0.06 | 0.06 | 0.12 | 0.06 |

FIG. 5

MATERIALS ANALYSIS USING BACKSCATTER ELECTRON EMISSIONS

CROSS REFERENCE TO RELATED APPLICATIONS

This application claims priority of U.S. Provisional Patent Application No. 60/427,905, filed Nov. 19, 2002, which application is incorporated herein by reference in its entirety for all purposes.

FIELD OF THE INVENTION

The present invention relates generally to materials analysis techniques, and more specifically to material composition analysis.

BACKGROUND OF THE INVENTION

Analysis of manufactured devices and materials is often required to ensure the quality of products ranging from sheet metal to semiconductor integrated circuit devices. Defects introduced during manufacturing processes can adversely affect the performance of these products. Conventionally, inspection of semiconductor integrated circuit devices by measuring the secondary electron emission levels provides adequate information concerning the structure of specific features and defects. However, semiconductor integrated circuit devices are continually getting smaller and therefore becoming more difficult to inspect. Image-based secondary electron measurement techniques become less effective for smaller samples because secondary electrons tend to scatter from the areas surrounding each feature of interest. This causes the measurements to be inaccurately representative of the feature.

To maintain high levels of inspection confidence, information in addition to structural information is required. One type of additional information is the composition of the inspected material. By using this information, defects and other imperfections can continue to be classified with confidence. Composition is conventionally determined by directing a high-energy, charged particle beam at a specimen and then measuring the characteristic x-rays that emanate from the specimen. Unfortunately however, this is very difficult since the large size, energy, costs and imprecise nature of x-ray detectors limits the accuracy of the composition measurements. Composition measurement accuracy is limited because x-rays also tend to emanate from areas that surround the areas of interest. The high energy of the charged particle beam causes the x-rays to emanate from the areas surrounding the features of interest. In view of the foregoing, a technique that can easily and accurately determine the composition of features on a sample specimen would be desirable. This desired technique would facilitate the acquisition of material inspection results at higher confidence levels.

BRIEF SUMMARY OF THE INVENTION

The present invention is directed to techniques for determining the composition of a specimen under inspection by measuring backscatter electron emissions and then estimating the atomic number of the specimen. Typically, this technique is useful for inspecting features, such as defects, upon very small specimens such as semiconductor wafers. Charged particle beams are typically required to cause backscatter electrons to emanate from a specimen.

One aspect of the present invention pertains to a method that involves acquiring an image of the area of interest, scanning the area of interest with a charged particle beam such that backscatter electrons emanate from the area of interest, measuring the backscatter electrons in order to determine a total backscatter electron count, calculating a normalized backscatter electron count, and estimating the atomic number of the material within the area of interest based upon the normalized backscatter electron count, whereby the atomic number allows an operator to determine the material composition within the area of interest. One embodiment of the method further involves scanning a reference specimen having a known atomic number such that backscatter electrons emanate from the reference sample, measuring the backscatter electrons emanating from the reference specimen in order to determine a total reference backscatter electron count, calculating a normalized reference backscatter electron current, and determining the atomic number of the specimen by evaluating a relationship between the known atomic number of the reference sample, the normalized backscatter electron count, and the normalized reference backscatter electron current.

Another aspect of the present invention pertains to a computer readable medium capable of executing the operations of the described inventive method. Yet another aspect of the present invention pertains to an inspection system for performing the method of the present invention.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which:

FIG. 5 illustrates an exemplary atomic number lookup table.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to techniques for determining the composition of a specimen under inspection by measuring backscatter electron emissions and then estimating the atomic number of the specimen. Typically, this technique is useful for inspecting features, such as defects, upon semiconductor wafers. This technique could also be used to validate the composition of an intended feature such as a patterned film on a semiconductor wafer. Charged particle beams are typically required to cause backscatter electrons to emanate from a specimen. One type of charged particle beam system that is useful for inspecting semiconductor wafers is a scanned electron microscope (SEM). A nearly identical measurement could be made with a charged ion beam system causing the emission of backscattered electrons from the specimen.

Figure 1:
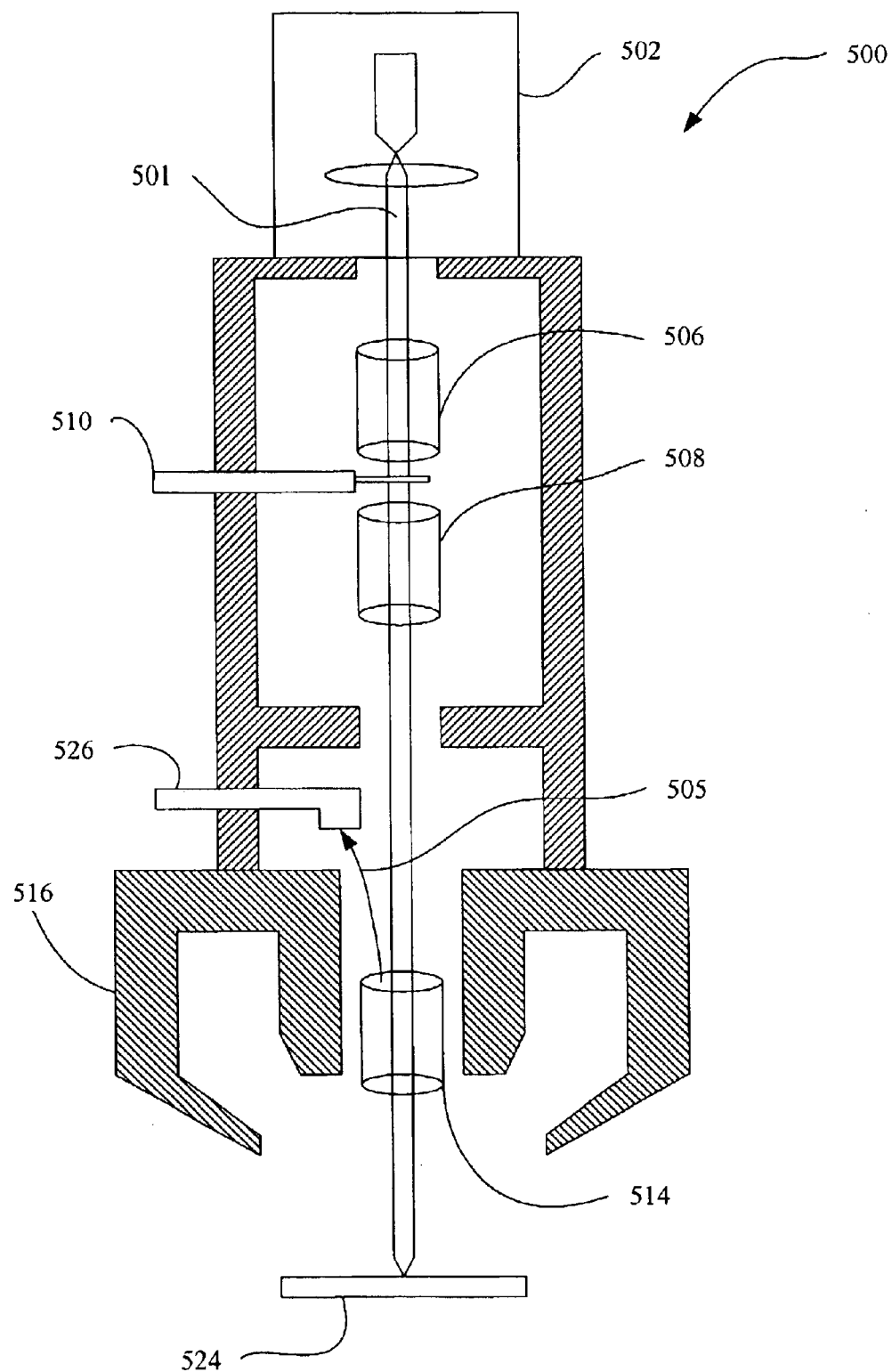
FIG. 1 illustrates a diagrammatic representation of an SEM in accordance with one embodiment of the present invention.

FIG. 1 illustrates a diagrammatic representation of an SEM 500 in accordance with one embodiment of the present invention. As shown, SEM system 500 includes an electron beam generator (502 through 516) that generates and directs an electron beam 501 substantially toward an area of interest on a specimen 524. The SEM system 500 may also include a detector 526 arranged to detect charged particles 205 (secondary electrons and/or backscattered electrons) emitted from the sample 524. The SEM may also include an image generator (not shown) for forming an image from the emitted particles.

The electron beam generator may be arranged in any suitable configuration for generating an electron beam that will result in secondary electrons being emitted from the sample 524. In one embodiment, the electron beam generator can include an electron source unit 502, an alignment octupole 506, an electrostatic predeflector 508, a variable aperture 510, a wien filter 514, and a magnetic objective lens 516. The source unit 502 may be implemented in any suitable form for generating and emitting electrons. For example, the source unit 502 may be in the form of a filament that is heated such that electrons within the filament are excited and emitted from the filament. The octupole 506 is configured to align the beam after a particular gun lens voltage is selected. In other words, the beam may have to be moved such that it is realigned with respect to the aperture 510.

The aperture 510 forms a hole through which the beam is directed. The lower quadrupole 508 may be included to compensate for mechanical alignment discrepancies. That is, the lower quadrupole 508 is used to adjust the alignment of the beam with respect to any misaligned through-holes of the SEM through which the beam must travel.

The Wien filter 514 provides a B×E field (e.g., a magnetic field's direction is perpendicular and directed away from a direction of an electric field) that is normal to the electron beam is path. The Wien filter 514 applies an E force on the beam that is opposite to the B force that is applied on the beam. Thus, the Wien filter does not substantially move the beam off axis. However, the Wien filter 514 applies the E force and B force on secondary electrons emitted from the sample in a same direction that is towards the detector 526. Thus, the Wien filter 514 deflects secondary electrons towards the detector 526. The Wien filter 514 and/or octopole 506 and/or quadrapole 508 may be configured to direct the beam across an area of the sample. By setting the X and Y scan voltages, a particular beam pattern may be selected. The deflection system may include a processor that may be also configured to control voltage settings on the electrodes, as well as scan voltages, as a function of incident beam position.

The magnetic objective lens 516 provides a mechanism for fine focusing of the beam on the sample. A plurality of electrostatic lens (not shown) may provide fast focus of the beam onto the sample surface. The SEM system 500 may include a support or stage (not shown) for supporting the sample 524.

The SEM system 500 may include a detector 526 for generating a detected signal from the detected secondary and/or backscattered electrons, or alternatively X-rays emitted from the sample in response to the electron beam. The detector may take the form of a micro-channel plate, microsphere plate, semiconductor diode, a scintillator/photomultiplier (PMT) assembly, an Energy Dispersive System (EDS), or a wavelength dispersive system (WDS) detector.

The SEM system 500 may also include an image generator (not shown) arranged to receive the detected signal and generate and/or store an image. The image generator is operable to generate an image based on the detected signal. Thus, the SEM system 500 may also include an analog to digital converter for converting the detected signal into a digital signal. The SEM system 500 may also include a computer system for processing the image frame data to generate an image of the sample. For example, successive image frame data may be averaged together to create the image.

Typically, sample 524 and the electron beam are enclosed within a vacuum environment. The vacuum chamber should be large enough to enclose a semiconductor wafer. SEM system 500 is configured to inspect very small features and defects on samples such as semiconductor wafers.

Figure 2:
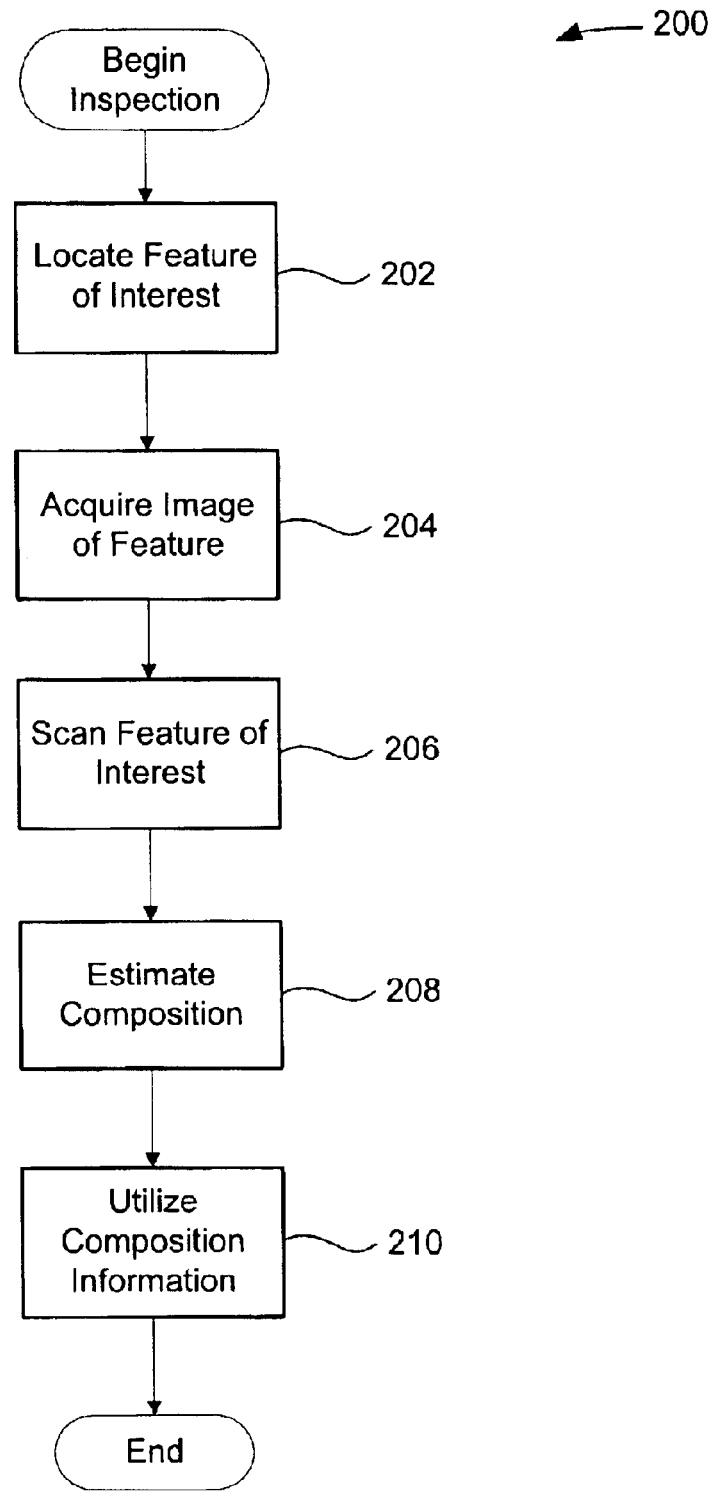
FIG. 2 illustrates a flow diagram that represents the basic operations involved with the composition analysis technique according to one embodiment of the present invention.

FIG. 2 illustrates a flow diagram that represents the basic operations involved with the composition analysis technique 200 according to one embodiment of the present invention. The process described in technique 200 is described as being implemented with a charged particle beam system, such as a scanning electron microscope. Composition analysis technique 200 begins at block 202 where an area of interest is located on a specimen to be inspected. The area of interest can be a defect or a specific feature that required analysis. For instance, a feature that may need analysis could be a via or an integrated circuit component. An area of interested can be located by using a database containing the location of various pre-determined areas of interest. This database can also be populated by obtaining information through an inspection process, such as an optical or charged particle inspection process. After a feature or area of interest is located, the field of view of the charged particle beam system is moved over the feature or area.

In block 204, an image of the feature or area of interest is acquired. This image can be acquired with various devices such as a charged particle beam system or an optical system. The charged particle beam system can form the image using secondary electron and/or backscatter electron detectors. After an image of the area of interest is generated, dimensions of features within the area of interest are collected. The dimensions of these features are used later in the composition analysis technique with atomic number lookup tables so that the atomic number of a feature or area can be estimated. These lookup tables are partially organized according to a specific dimension of a feature. These dimensions include length, width, largest dimension, area and overall shape types such as rectangular, circular, needle-like or irregular.

In block 206, the feature of interest, a subset of the total area of interest, is scanned with the electron beam of the SEM so that backscatter electrons can be collected. Typically, the area is scanned in a raster pattern. In order to scan the area of interest, the SEM is required to have certain settings adjusted. For instance, the incident beam current level of the SEM should be set to a level appropriate for the specimen. Also, the amount of time during which backscatter electrons will be measured should be set. This amount of time is referred to as the "acquisition time." The acquisition time will be selected based on the size of the feature of interest and the type, structure, and composition of the semiconductor wafer substrate.

During the scanning process, the electron beam causes backscatter electrons to emanate from the specimen. Detectors within the SEM system are arranged to detect and measure the total amount of backscatter electrons. The present invention detects backscatter electrons during this operation because backscatter electrons tend to result in more accurate composition analysis results. In contrast, secondary electron emissions are more suitably used for structural analysis techniques.

After the total amount of backscatter electrons is measured, the normalized backscatter electron count is calculated. The normalized backscatter electron count level is used as one of the measurement parameters for determining the composition of the material within the area of interest. The normalized backscatter electron count is calculated by dividing the total amount backscatter electrons by the total incident beam current level and the acquisition time. The total incident beam is the amount of current in the charged particle beam that is directed at the area of interest on the specimen. Shown in equation format:

$$k = \frac{N_{TBS}}{I_{IB} \times t_{Acq}}$$

wherein k represents the normalized backscatter electron count level, $N_{TBS}$ represents the total backscatter electron count, $I_{IB}$ represents the total incident beam current, and $t_{Acq}$ represents the acquisition time. k is similar to a backscatter electron coefficient.

k is calculated because the incident beam current level tends to fluctuate during regular system operation. The incident beam current is assumed to be constant during the measurement of an individual defect. If it is not stable, continuous measurement of the incident beam current is made during the backscatter electron count measurement. Changes in the incident beam current cause the level of backscatter electrons that emanate from the specimen to fluctuate in proportion. This in turn causes the total amount of backscatter electron current to reflect not only the amount of backscatter electrons, but also the fluctuation in incident beam current. This makes the total amount of backscatter electron current an inaccurate parameter to use when measuring characteristics about a specimen. On the other hand, a normalized backscatter electron count value factors out the fluctuations in the incident beam current and therefore provides a more accurate measuring parameter.

In block 208, the normalized backscatter electron count is used to determine the composition of the material within the area of interest. Further description of the operations used to complete the block 208 are provided with respect to FIGS. 3 and 4 below.

In block 210, the material composition information determined in block 208 can be used in further specimen inspection processes. For example, the information can be used to tune another inspection system to the type of material within the specimen. Specifically, the energy of a charged particle beam can be set to the lowest energy level appropriate for the specific material type so that accurate measurements can be obtained. Higher energy levels than necessary cause a charged particle beam to irradiate more than the desired area to be inspected, which causes inaccurate measurements. Additionally, this is a waste of energy. Also, when a defect is determined to be a low atomic number (Z<20) element, an electron optical column can be optimized for low atomic number elements. On the other hand, when a defect exhibits a high atomic number element signature, a high kilovolt electron beam is usually determined to be more suitable for further inspection.

The composition information also can be used to improve the accuracy of defect classification techniques. For example, the composition information can be used to sort features or defects into bins (or categories) according to composition or atomic numbers. One example of a set of bins has bins of the categories of: low atomic number, mid-atomic number, transition metal, and heavy elements. An alternative set of bins is categorized by atomic numbers wherein each bin includes defects having atomic numbers within a specific range. For example, each bin can cover a range of 5 atomic numbers.

Figure 3:
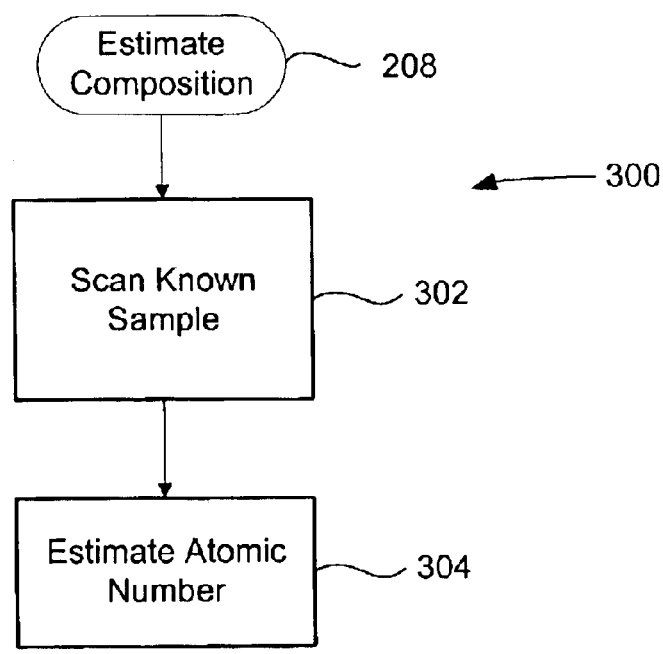
FIGS. 3 and 4 illustrate flow diagrams describing further details for the operation of estimating the composition of the material within the specimen.
Figure 4:
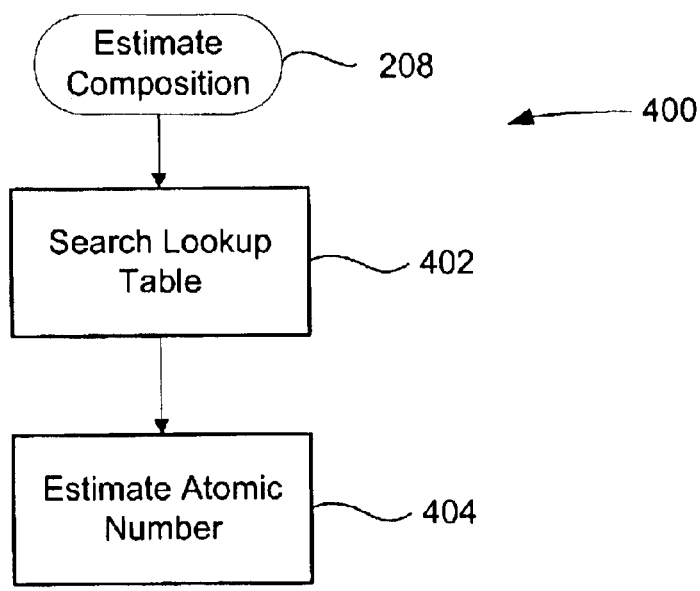

FIGS. 3 and 4 illustrate alternative flow diagrams describing further details for the operation of estimating the composition of the material within the specimen (block 208). FIG. 3 describes the process of scanning a reference specimen of which the atomic number is known and FIG. 4 describes a process of using an atomic number lookup table.

The composition estimation technique 300 of FIG. 3 includes an operation of scanning a sample of known composition and physical dimensions 302 and then estimating the atomic number 304. Scanning the sample with the electron beam involves raster scanning and detecting the total amount of backscatter electron current emanating from the sample. This sample is referred to as the reference sample since the material composition and the atomic number are known. The backscatter electron count for the reference sample is referred to as the total reference backscatter electron count.

After the total reference backscatter electron count is measured, the normalized reference backscatter electron count is calculated. The normalized reference backscatter electron count level is also one of the measurement parameters for determining the composition of the material within the area of interest. The normalized reference backscatter electron count is calculated in an analogous manner in which the normalized backscatter electron count was calculated. The normalized reference backscatter electron count is calculated by dividing the total reference backscatter electron count by the incident beam current level and the acquisition time used to collect the backscatter electrons about the reference sample. This amount of acquisition time is referred to as the reference acquisition time. Shown in equation format:

$$k_R = \frac{N_{TRBS}}{I_{IB} \times t_{RAcq}}$$

wherein $k_R$ represents the normalized reference backscatter electron current level, $N_{TRBs}$ represents the total reference backscatter current level, $I_{IB}$ represents the total incident beam current, and $t_{RAcq}$ represents the reference acquisition time. The normalized reference backscatter electron current level is calculated for the same reasons that the normalized reference backscatter electron current level is calculated. That reason again is for accuracy purposes of the composition analysis. As discussed the atomic number of the sample is already known since the sample is a reference sample.

At block 304, the estimated atomic number of the material within the area of interest is generated. This is performed by solving an equation in which 3 out of 4 quantities are known This method relies on two well known concepts: 1) normalized backscatter count varies monotonically with atomic number and 2) normalized backscatter count for a material of mixed composition is the linear combination of the normalized backscatter counts of the individual constituents For more information see Scanning Electron Microscopy and X-ray Microanalysis $2^{nd}$ edition, Goldstein, Newbury, Echlin, Joy, Romig Jr.,Lyman, Fiori and Lifshin, Plenum Press, pages 90–96, which is incorporated herein by reference. The three known quantities are: the atomic number of the reference sample, the normalized reference backscatter electron current, and the normalized backscatter electron count. The unknown quantity is the atomic number of the sample. By using standard equation solving programs or by using manual calculation methods, the atomic number of the sample can be determined. Determination of the atomic number then allows an inspection operator or a computer software program to determine the material composition of the area of interest on the sample. An exemplary equation for determining the atomic number of the sample is shown here:

$$(AtomicNumber)_{Specimen} = k \times \frac{(AtomicNumber)_{Reference}}{k_R}$$

Note that the reference materials be of similar atomic number as that of the unknown specimen.

When the operations illustrated in FIG. 3 are used to estimate the atomic number of the specimen, size parameters of the features of interest are not strictly necessary. Therefore, the operation of obtaining feature size dimensions is optional when the operations of FIG. 3 are used to estimate the atomic number. However, the data acquisition parameters for each of the inspected specimen and the reference sample should be approximately the same in order to increase the accuracy of the analysis process. These acquisition parameters include the electron beam energy, the electron beam current, the incident angle of the electron beam, the acquisition time, and the size and shape of the areas that are raster scanned on each of the inspected specimen and the reference sample.

FIG. 4, an alternative technique 400 for estimating the composition of the sample, will now be described. The operations of technique 400 include using an atomic number lookup table in block 402 and then estimating the atomic number of the sample from the lookup table in block 404. In block 402, the normalized backscatter electron count calculated in block 206 and feature/defect size parameters collected in block 204 are used with atomic number lookup tables in order to estimate the atomic number of the sample. An example of an atomic number lookup table 500 is shown in FIG. 5.

Average atomic number lookup table 500 includes a size column 502 and multiple atomic number columns 504, 506, and 508. Size column 502 contains a column of feature or defect size parameters. These parameters can represent the length, width, or largest dimension of a feature or defect of which the composition is to be determined. There could be separate tables for different global shapes of defects if more accurate results are desired. The atomic number lookup table 500 is set up to determine atomic numbers with respect to one of such dimensional sizes. Atomic number columns 504, 506, and 508 include normalized backscatter electron count values. Each of the normalized backscatter electron count values correspond to a respective defect size and atomic number. Therefore, since the technique of the present invention as described so far determines the values of the normalized backscatter electron count in block 206 and size parameters in block 204, atomic number lookup table 500 can be used to find the atomic number of the sample. This can be done by first locating a dimension of the feature investigated by scanning down size column 502. This is represented by the direction arrow labeled "$1^{st}$." The size parameter searched for should be of the type that the lookup table is set up for. For example, a width value should be searched for if the table is set up for the width of defects.

Then, the normalized backscatter electron count is located by scanning across the row for the respective feature size. This is represented by the directional arrow labeled "$2^{nd}$." Then the atomic number of the sample is found by identifying which atomic number column 504, 506, or 508 that the normalized backscatter electron count is found in. In some cases it will be necessary to interpolate or extrapolate between atomic number columns in order to determine the atomic number. Alternatively, an estimate of the atomic number can be derived by determining which atomic number column contains a normalized backscatter current value closest to the measured current value.

For exemplary purposes, normalized backscatter electron count value of 0.10, designated within circle 510 represents the current value for a defect with a size parameter of 0.04 urn and an atomic number of B.

Table 500 can have more or less columns of atomic numbers than what is shown in FIG. 5. The atomic number lookup tables can be developed through empirical tests or through theoretical modeling. In some cases a lookup table can be a combination of empirical test results and theoretical modeling. This may be necessary when empirical testing is difficult or has not been performed. Empirical modeling algorithms include Monte Carlo technique for calculating backscatter coefficients using the simulation of electron scattering into realistic structures (this would be well known to experienced practitioners). Well known empirical equations for bulk samples could also be used as a starting point. One such example is (same reference):

$$\eta = a + bZ + cZ^2 + dZ^3$$

$\eta$ is the backscatter coefficient, another way of expressing the normalized backscatter electron count, and a, b, c and d are empirically determined coefficients. These coefficients are estimated from a few measurements of reference materials. For bulk references, the coefficients have been measured by researchers to be −0.0254, 0.016, −1.86×10$^{-4}$ and 8.3×10$^{-7}$, respectively.

It is should be understood that the techniques of the present invention can be carried out through manual calculations or through the use of algorithms programmed into software programs. With respect to using the atomic lookup table, the values of size and normalized backscatter electron count are considered input values that are utilized with a lookup table. An algorithm that uses the lookup table then outputs the atomic number for the specimen.

In alternative embodiments of the present invention, the techniques can be used to determine the value of a characteristic other than the composition. For instance, a reference specimen having a known characteristic value other than atomic number can substitute for the specimen having the known atomic number. For example, if the composition or average atomic number is known, density could be determined from the measurement of backscatter electron count. Density can manifest itself in several ways, including homogeneous density and heterogeneous density. Heterogeneous density changes could be due to voids in a feature. In another alternative embodiment, the lookup table can have columns arranged by another characteristic value other than the atomic number. In each of these cases, the normalized backscatter electron count will be used to estimate a characteristic value of a specimen.

An advantage of the present invention is that backscattered electrons may be obtained in a first scan of the surface of a specimen. Alternatively, the backscattered electrons may already be available before the techniques of the present invention are begun. Typically, the techniques of the present invention can be carried out very quickly. Therefore the present invention can be integrated into a semiconductor fabrication process without slowing down the fabrication speed and decreasing the productivity yield.

Figure 6:
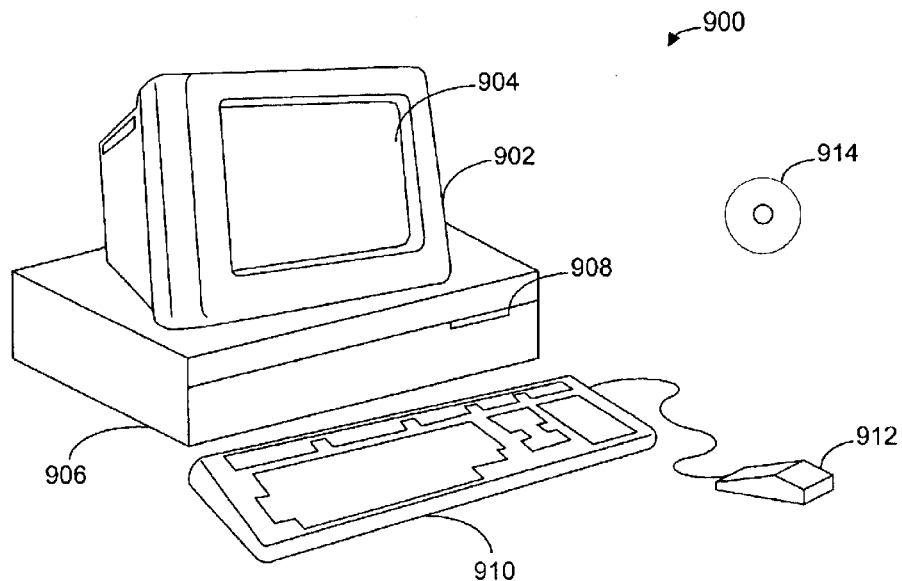
FIGS. 6 and 7 illustrate a computer system suitable for implementing embodiments of the present invention.
Figure 7:
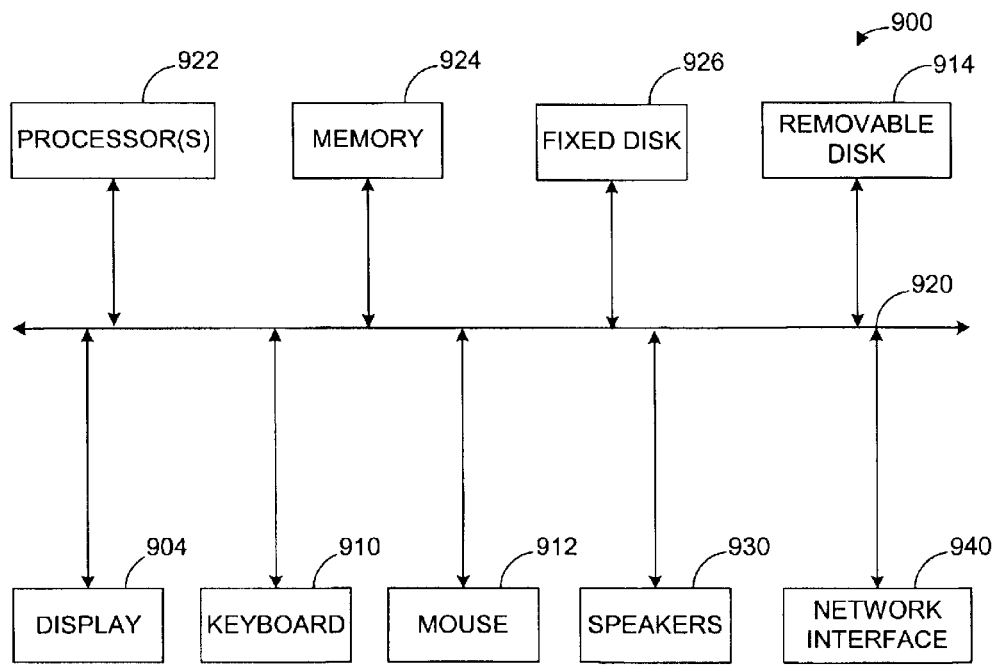

FIGS. 6 and 7 illustrate a computer system 900 suitable for implementing embodiments of the present invention. FIG. 6 shows one possible physical form of the computer system. Of course, the computer system may have many physical forms ranging from an integrated circuit, a printed circuit board and a small handheld device up to a huge super computer. Computer system 900 includes a monitor 902, a display 904, a housing 906, a disk drive 908, a keyboard 910 and a mouse 912. Disk 914 is a computer-readable medium used to transfer data to and from computer system 900.

FIG. 7 is an example of a block diagram for computer system 900. Attached to system bus 920 are a wide variety of subsystems. Processor(s) 922 (also referred to as central processing units, or CPUs) are coupled to storage devices including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data and the like and is typically a secondary storage medium (such as a hard disk) that is slower than primary storage. It will be appreciated that the information retained within fixed disk 926, may, in appropriate cases, be incorporated in standard fashion as virtual memory in memory 924. Removable disk 914 may take the form of any of the computer-readable media described below.

CPU 922 is also coupled to a variety of input/output devices such as display 904, keyboard 910, mouse 912 and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that arc specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method for determining the material composition of an area of interest on a semiconductor specimen comprising:

acquiring an image of the area of interest, determining a dimension of a feature within the area of interest;

scanning the area of interest with a charged particle beam such that backscatter electrons emanate from the area of interest;

measuring the backscatter electrons in order to determine a specimen total backscatter electron count, wherein the backscatter electrons are measured for an amount of time referred to as an acquisition time;

calculating a specimen normalized backscatter electron count by dividing the specimen total backscatter electron count by a total charged particle beam current and the acquisition time; and estimating the atomic number of the material within the area of interest by looking up the approximate atomic number for the feature within a lookup table according to the dimension of the feature and the specimen normalized backscatter electron count, wherein the lookup table includes normalized backscatter electron count values wherein each column of normalized backscatter electron count values corresponds to an atomic number and each row of normalized backscatter electron count values corresponds to a dimension of the feature, whereby the atomic number allows an operator to determine the material composition within the area of interest.

2. A method as recited in claim 1 further comprising:

loading the semiconductor specimen into a vacuum chamber so that it can be inspected by the charged particle beam.

3. A method as recited in claim 1 further comprising:

categorizing the specimen according to the estimated atomic number into a category of low atomic number, mid-atomic number, transition metal, or heavy metal.

4. A method as recited in claim 1 further comprising:

tuning a beam generator of a defect inspection device by setting the current level of the beam generator to an energy setting such that a beam generated by the beam generator causes electrons to emanate from a defect but substantially not from the area surrounding the defect.

5. A method as recited in claim 1 wherein the operation of acquiring the image further comprises:

directing a charged particle beam onto the area of interest such that the charged particle beam causes electrons to emanate from the area of interest;

detecting the electrons emanating from the area of interest; and forming an image of the area of interest using the detected electrons.

6. A method as recited in claim 1 wherein the operation of acquiring the image further comprises:

focusing an optical inspection device upon the area of interest in order to optically form an image of the area of interest.

7. An inspection system for determining the material composition of an area of interest on a semiconductor specimen comprising:

a vacuum chamber in which the semiconductor specimen in contained;

a charged particle beam for scanning an area of interest on the semiconductor specimen, wherein the charged particle beam causes backscatter electrons to emanate from the area of interest;

a detector positioned proximate to the semiconductor specimen being configured to measure backscatter electrons in order to determine a specimen total backscatter electron count, wherein the backscatter electrons are measured for an amount of time referred to an acquisition time;

a first processing unit configured to calculate a specimen normalized backscatter electron count by dividing the specimen total backscatter electron count by a total charged particle beam current and the acquisition time;

a second processing unit configured to estimate the atomic number of the material within the area of interest based upon the normalized backscatter electron count, whereby the atomic number allows an operator to determine the material composition within the area of interest;

an image analysis module configured to extract dimensions of a feature within the area of interest; and an atomic number lookup table having a list of dimensional values wherein each dimensional value is related to a set of normalized backscatter electron count values wherein each of the current values are also related to a respective atomic number, whereby the calculated normalized backscatter electron count and the extracted dimensions allows the atomic number lookup table to be used to estimate the atomic number of the specimen.

8. A method as recited in claim 1 wherein the operation of estimating of the atomic number further comprises:

identifying the size parameter of the feature within the lookup table;

identifying the specimen normalized backscatter electron count value within the row of normalized backscatter electron count values that corresponds to the size parameter of the feature; and identifying the specific column within which the specimen normalized backscatter electron count value is located, whereby the atomic number corresponding to the specific column is approximately equal to the atomic number of the feature.

9. A method as recited in claim 1, wherein the lookup tables are partially organized according to a specific dimension of a feature. These dimensions include length, width, largest dimension, area and overall shape types such as rectangular, circular, needle-like or irregular.

10. The inspection system as recited in claim 7, wherein the lookup tables are partially organized according to a specific dimension of a feature. These dimensions include length, width, largest dimension, area and overall shape types such as rectangular, circular, needle-like or irregular.

* * * * *

UNITED STATES PATENT AND TRADEMARK OFFICE
CERTIFICATE OF CORRECTION

PATENT NO. : 6,753,525 B1
DATED : June 22, 2004
INVENTOR(S) : Anne L. Testoni

It is certified that error appears in the above-identified patent and that said Letters Patent is hereby corrected as shown below:

Column 12,
Line 31, change ". These dimensions include" to -- , wherein the dimension includes --.
Line 32, change "shape types such as" to -- shapes including --.
Line 36, change ". These dimensions include" to -- , wherein the dimension includes --.
Lines 36 and 37, change "shape types such as" to -- shapes including --.

Signed and Sealed this

Twenty-eighth Day of December, 2004

JON W. DUDAS
*Director of the United States Patent and Trademark Office*

UNITED STATES PATENT AND TRADEMARK OFFICE
CERTIFICATE OF CORRECTION

PATENT NO. : 6,753,525 B1
DATED : June 22, 2004
INVENTOR(S) : Anne L. Testoni

It is certified that error appears in the above-identified patent and that said Letters Patent is hereby corrected as shown below:

<u>Column 12,</u>
Line 31, change ". These dimensions include" to -- , wherein the dimension includes --.
Line 32, change "shape types such as" to -- shapes including --.
Line 36, change ". These dimensions include" to -- , wherein the dimension includes --.
Lines 36 and 37, change "shape types such as" to -- shapes including --.

Signed and Sealed this

Fifteenth Day of February, 2005

JON W. DUDAS
*Director of the United States Patent and Trademark Office*